METHOD OF MANUFACTURING A SEMICONDUCTOR DEVICE

Filed June 20, 1969

INVENTORS
HERMAN FRENTZ
BERNARD H. WEIJLAND
BY
AGENT

United States Patent Office 3,649,387

Patented Mar. 14, 1972

3,649,387

METHOD OF MANUFACTURING A SEMICONDUCTOR DEVICE

Herman Frentz, Nijmegan, Netherlands, and Bernard Hendrik Weijland, Beaverton, Oreg., assignors to U.S. Philips Corporation, New York, N.Y.

Filed June 20, 1969, Ser. No. 834,972
Claims priority, application Netherlands, June 21, 1968, 6808723
Int. Cl. H01l 7/44
U.S. Cl. 148—187 9 Claims

ABSTRACT OF THE DISCLOSURE

In the manufacturing of a semiconductor device in which a semiconductor body is locally dopped by diffusion from a masking material which comprises an impurity, the incidental diffusion of the impurity from the masking material into a surface of the semiconductor body which is unmasked is checked by performing the diffusion process in the presence of a powder of a semiconductor material. This method also permits the diffusion of two or more impurities during a single diffusion process.

The invention relates to a method of manufacturing a semiconductor device in which a semiconductor body is locally doped by diffusion and in which during the diffusion process a layer of a masking material which comprises an impurity is applied to a part of the surface of the semiconductor body, another part of the semiconductor surface being unmasked, and to a semiconductor device manufactured by this method.

The term semiconductor device is to be understood to include e.g. diodes, transistors, thyristors, field effect transistors and integrated circuits.

The term impurity is to be understood to means herein a doping substance which can influence the conductivity properties, for example, the conductivity type and/or the electric resistance of the semiconductor body. The impurity may be chosen, for example, from donors and/or acceptors suitable for the semiconductor body.

A layer of masking material is used in the technology of the planar semiconductor devices not only as a masking for local diffusion of impurities from the gaseous phase, but also for other purposes, for example, as a diffusion source of impurities, as a protection against atmospheric influences and as an insulating coating on the semiconductor surface.

The layer may consist, for example, of the substances aluminium silicate, silicon oxide, and/or silicon nitride, and if required, of a number of these substances which, if desirable, may form a number of parts of the layer situated beside and/or on each other.

In known methods of the type mentioned in the preamble (see U.S. patent specification 3,200,019) the semiconductor body is heated in an oven while an inert gas flows through it at a temperature at which diffusion of the impurity can occur from the layer in the adjoining part of the semiconductor body situated below the layer.

In this method the impurity may evaporate from the layer as such or in the form of a volatile compound of the impurity at the diffusion temperature, the danger existing that the impuritiy diffuses in the unmasked part of the semiconductor surface. Actually it can often not be prevented that the gas flow conveys the evaporated impurity along the unmasked part. However, the method mentioned in the preamble is not restricted to the diffusion in a flowing gas. For the diffusion in a closed space, the above-mentioned drawbacks hold good to an even stronger extent.

It is the object of the invention to avoid the above-mentioned drawback at least for the greater part. It is based on the recognition of the fact that diffusion of the impurity from the masking material in the unmasked part of the semiconductor surface can be checked when the impurity or a compound thereof, as soon as it is liberated at the surface of the layer, is immediately conducted away via the gaseous phase in a manner which substantially excludes the possibility of contact of the impurity with the unmasked part or at least strongly reduces it.

The method mentioned in the preamble is therefore characterized in that diffusion of the impurity from the layer of masking material in the unmasked part of the surface is checked by performing the diffusion process in the presence of a powder of semiconductor material.

Due to the presence of powder of semiconductor material there is, proportionally with the size of the surface, competition between the unmasked, i.e. exopsed, part of the semiconductor surface and the powder surface as regards the taking up of the impurity. The performance of the diffusion is particularly simple when the semiconductor body and the powder can be maintained at the same temperature. Therefore the powder used preferably consists of the same semiconductor material as the semiconductor body.

For the diffusion and the gettering process it is of importance that a suitable atmosphere is built up around the semiconductor body and the semiconductor powder. Diffusion is therefore preferably carried out in a closed space.

The gettering effect of the powder can often be improved when the atmosphere in which said process is performed is free from inert constituents which form obstacles for the transport of impurities in the gaseous phase. Therefore the space is preferably evacuated and hermetically sealed prior to the diffusion process.

The method according to the invention has many advantages. This is the case, for example, when the layer of masking material which contains, for example, phosphorus as an impurity, serves as a protection against atmospheric influences. In this case the impurity is situated in a part of the layer which does not adjoin the semiconductor surface situated below the layer. As a result of the presence of the semiconductor powder, the impurity from the masking layer, in as far as it is evaporated, will substantially entirely be taken up during the diffusion process in the semiconductor powder and substantially not in the unmasked part of the surface of the semiconductor body.

In a preferred embodiment of the method according to the invention the impurity from the layer of masking material is diffused in the underlying part of the semiconductor body. The great advantage hereof is that doping of a semiconductor body at the area where it is covered with a masking layer can be realized without the danger of doping of the exposed part of the surface with the impurity.

The diffusion of the impurity need not take place in the whole part of the semiconductor body situated below the layer of masking material. This diffusion can be restricted if, according to a preferred embodiment of the method according to the invention, the impurity is provided only locally in the masking material which adjoins the semiconductor surface.

The method according to the invention is of particular advantage in the case in which at least one other impurity is diffused from the gaseous phase at least in the unmasked part of the semiconductor surface. Particularly in the case in which an impurity is diffused from the gaseous phase, it is of importance that a gettering semiconductor powder is present to check diffusion of the impurity from the masking layer on the same place, namely the unmasked part of the semiconductor surface. This also presents the possibility of diffusing more than one impurity, for example, one impurity from the masking layer and one from the gaseous phase, simultaneously and spacially separated into the semiconductor body, so that many operations can be saved.

As a diffusion source for the impurities which is diffused from the gaseous phase, many possibilities are available to those skilled in the art. Said impurity may be used as an element or as a compound either in powder from or in a compact form. This impurity may also be mixed with an inert carrier material.

The semiconductor powder used will preferably contain the impurity which is diffused from the gaseous phase in a powder form. In itself the use of a semiconductor powder which contains an impurity for doping a semiconductor body for diffusion of an impurity from the gaseous phase is known. The semiconductor powder used in the method according to the invention also takes up the impurity from the masking layer. Such a powder has the advantage that one powder is used both to check an undesirable diffusion of the impurity from the masking layer into the unmasked part of the surface and to cause the other impurity to diffuse.

The semiconductor powder used preferably contains the impurity which is diffused from the gaseous phase in a dissolved form. As a result of this very readily predictable and reproducible results are achieved in the diffusion process. This is associated with the fact that upon diffusion a stationary equilibrium is adjusted in which the concentration of the impurity which is diffused from the gaseous phase can be approximately equal at the semiconductor surface to the concentration of the impurity in the semiconductor powder. As semiconductor materials are to be considered, for example, the known elements, for example, silicon and germanium, their mixed crystals and compounds, for example, the $A^{III}B^{V}$ compounds.

As the impurity in the masking material and the impurity which is diffused from the gaseous phase may be chosen those elements which are known as donors and acceptors in the above-mentioned semiconductor materials. It is known that compounds of non-volatile doping elements can be very volatile. For example, p- and n-regions, respectively, can be diffused in the semiconductor body with boron oxide which is volatile at high temperatures, in a silicate layer on a semiconductor consisting of silicon and with elementary phosphorus in a silicon powder source, upon heating at 1000° C.–1300° C. It is found however, that the diffusion process, in which diffusion of boron and phosphorus occurs in the semiconductor body, takes place at the same diffusion temperature when phosphorus in the form of phosphorus oxide is used as the impurity in the layer of masking material and the sparingly volatile boron in an elementary or dissolved form is used as the impurity in the semiconductor powder. This unexpected result is possibly associated with certain equilibriums in the gaseous phase during the diffusion process, in which, in addition to the sparingly volatile boron, the volatile boron oxide occurs and, for example, in addition to silicon, silicon monoxide and silicon dioxide.

In order that the invention may be readily carried into effect, it will now be described in greater detail, by way of example, with reference to the accompanying drawing, in which FIG. 1 diagrammatically shows a longitudinal vertical sectional view of a device in which the method according to the invention is carried out;

Figure 1:
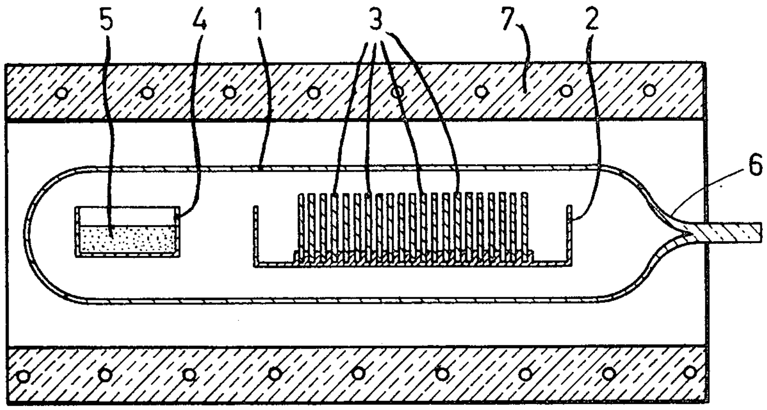

A device as shown in FIG. 1 is used in the comparative experiments and examples to be described hereinafter.

A quartz tube 1 (see FIG. 1), approximately 35 cm. long, approximately 3.8 cm. inside diameter, comprises a quartz holder 2, in which one or more semiconductor bodies in the form of disks 3 of semiconductor material, for example, monocrystalline silicon, are arranged. The number of disks may vary strongly, for example, from 3 to 300. The diameter of the disks is, for example, from 2.4 to 3.0 cm., and the thickness, for example, approximately 225 $\mu$m. The disks are covered with a masking layer which previously is restricted to a part of the semiconductor surface, by etching by means of photoresist methods known per se, so that another part of the surface is unmasked. The quartz tube also comprises a quartz tray 4 containing, for example, 12 gms. of semiconductor powder 5 per 10 disks. The grain size of the powder is under 40 $\mu$m. and in a tube with 10 disks having a diameter of 2.4 cm. this gives already a ratio powder surface to total semiconductor surface (masked and unmasked) of more than 100:1. Before the disks 3 and the powder 5 were provided, the tube 1 was open at the end 6 through which the powder and the semiconductor disks were inserted into the tube. The tube is then evacuated in an oven at 600° C. and fired for 1 hour, during which treatment the pressure is maintained at approximately $5.10^{-5}$ torr. The quartz tube is then sealed at the end 6, while maintaining the vacuum, and heated in an oven 7. Dependent on, for example, the diffusion rate of the impurities and the desired diffusion depth, said heating is carried out, for example, for from 1–13 hours at 1000° C. to 1300° C.

The above described apparatus was used in the examples and comparative experiments to be described below. A good impression of the effect of the powder is obtained when the same experiments are carried out with and without powder. These experiments are described first. Before introducing ten disks consisting of n-type silicon having a resistivity of 20 ohm cm. into the quartz tube, the disks are provided with a borate glass layer in the conventional manner at a comparatively low temperature at which a negligible diffusion in the semiconductor material occurs, by a treatment of the disks in a gas atmosphere which contains tetra ethyl silicate and triethyl borane, in a volume ratio of approximately 92:8. The boron content of the glass layer is such that upon diffusion a surface concentration of $3.10^{20}$ at./cc. is obtained at the semiconductor surface below the layer. The thickness of the masking layer is approximately 0.4 $\mu$m. By means of photoetching methods an aperture is made in the layer. It is found in the thermal treatment at 1240° C. for 3 hours that, when no powder is present, boron diffuses in the unmasked part of the surface, the concentration of the boron at the unmasked semiconductor surface being $2.5\times10^{20}$ at./cc. This can be derived in a manner known per se from the measurement of the resistance per square of and the depth of the penetration of the boron into the unmasked part of the semiconductor surface. The resistance is determined from a 4-point resistance measurement and the depth of penetration is established by grinding the surface of the disks at an angle of 6° and treating with a copper ion solution, as a result of which p-regions and n-regions assume different colours.

When 12 gms. of silicon powder having a grain size of 40 $\mu$m. are present in the tube, boron diffusion occurs in the unmasked part of the semiconductor surface to a concentration at the surface which is smaller than $10^{19}$ at./cc. When the powder contains $10^{19}$ at P/cc., the originally n-type silicon remains of the n-type.

EXAMPLE 1

Figure 2:
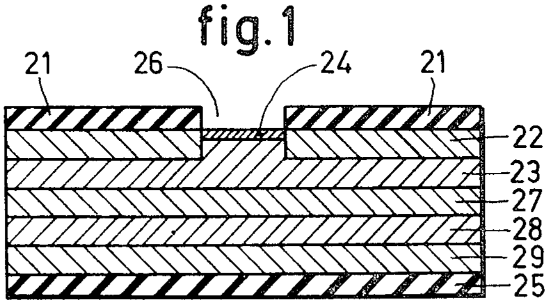
FIG. 2 is a diagrammatic cross-sectional view of a thyristor manufactured by means of the method according to the invention.

Aluminium is previously diffused on either side in an n-type silicon disk having a resistivity of 20 ohm. cm. (see FIG. 2), so that the regions 23 and 28 are formed having a thickness of 53 $\mu$m., separated by a region 27 of the original material having a thickness of 119 μm. A layer of borate glass 21, 25 is then provided on the disk in the manner as described above, in which layer an aperture 26 is formed. Boron and phosphorus are then simultaneously diffused in the semiconductor body, the boron from the glass layer and the phosphorus from phosphorus containing silicon powder, which is provded in the quartz tube. Starting material may be a standard mixture of silicon powder with $10^{21}$ at./cc. of phosphorus and this may be diluted with pure silicon powder as is described. The diffusion process lasts 1 hour and is carried out at 1240° C. Below the glass layer the boron forms the regions 22 and 29 which have a depth of 10 μm. and the phosphorus forms the region 24, which has a depth of 11 μm., through the aperture 26.

After the diffusion process the phosphorus concentration at the semiconductor surface, is $2.10^{20}$ at./cc., equal to the average concentration of the phosphorus in the silicon powder.

The npnp-configuration obtained by said diffusion treatment may be processed in known manner to a thyristor by providing a cathode contact at the region 24, an anode contact at the region 29 and a control contact at the region 22.

In a variation to this example, phosphorus is incorporated in the glass layer and boron is incorporated in the silicon powder. This latter may be carried out, for example, by preparing the boron-doped powder on a rod which has been drawn from a silicon melt to which boron has been added. The concentration of boron in the powder may have a value, for example, between $10^{19}$ and $5.10^{20}$ at./cc. and the concentration of the phosphorus in the masking layer may be such that the concentration at the surface upon diffusion is $10^{19}$ to $10^{21}$ at./cc.

It is not necessary that the impurity in the masking layer and the impurity which is diffused from the gaseous phase are of opposite conductivity types.

Figure 3:
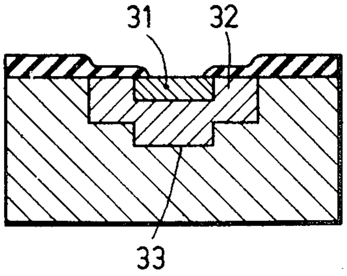
FIG. 3 is a diagrammatic cross-sectional view of a known transistor.

By means of the method according to the invention a known problem in preparing semiconductor devices can be avoided. If, actually, a transistor is manufactured in a known manner by means of two successive planar diffusion processes (see FIG. 3) in which first a base 32 and then an emitter 31 are diffused, the base, in as far as it is situated below the emitter, is forced from the surface into the semiconductor body by the emitter diffusion, so that the base-collector junction shows a bulge 33 which has a harmful influence on the electric properties of the transistor. As will be illustrated with reference to the following example, such a bulge can be prevented by means of the method according to the invention.

EXAMPLE 2

A layer 41 of boron glass is formed in the manner described above in an epitaxial layer 47 having a resistivity of 1.5 ohm cm. and a thickness of 4.2μ provided on a disk 48 consisting of Sb-doped n-type silicon having a resistivity of 0.007 ohm cm. (see FIG. 4). An aperture 42 is provided in the glass layer by means of photoetching methods. The other side of the disk is screened from diffusions, for example, by an undoped layer of glass.

Figure 4:
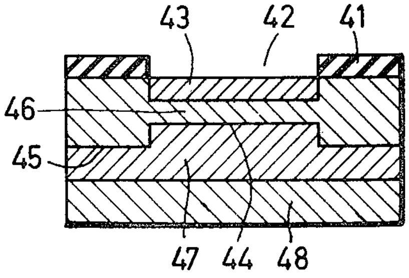
FIG. 4 is a diagrammatic cross-sectional view of a transistor manufactured by means of the method according to the invention.

The silicon powder contains $10^{21}$ at./cc. As and $10^{19}$ at./cc. B, which impurities diffuse in the semiconductor body through the aperture 42 in the glass layer as a result of which the n-type region 42 and the p-type region 46, respectively, are formed. The diffusion lasts 1 hour and is carried out at 1050° C. A surface concentration of $3.10^{20}$ at./cc. of boron is formed below the glass layer 41. So in this example, a double boron diffusion is simultaneously used, namely one with high surface concentration from the glass layer 41, and one with a lower surface concentration through the aperture 42 in the glass layer. As a result of the slow diffusion and the high concentration of As, this will predominate in the unmasked region 43, which has a depth of 0.23 μm., of the semiconductor body especially near the surface and the boron will penetrate deeper in the semiconductor body. This depth of penetration is larger for the boron, which diffuses from the glass layer in the semiconductor body, where the location of the collector-base junction is denoted by 45 (depth 1.5 μm.), than for the boron which diffuses via the aperture 42, where the location of the collector-base junction is denoted by 44 (depth 0.54 μm.). In this manner the transistor configuration with the base region 46 shown in FIG. 4 is obtained. It is found that the length and the width of the base can be accurately controlled and that the transistor manufactured by means of this embodiment of the method according to the invention does not show the above-mentioned bulge.

EXAMPLE 3

The thyristor described in Example 1 can also be manufactured in one diffusion step, since Al can diffuse through a glass layer.

On either side of an n-type silicon disk, a layer of borate glass 21, 25 is provided in the manner as described above (see FIG. 2). On one side an aperture 26 is etched in the layer of borate glass. The disk is then heated in a quartz tube as described with reference to FIG. 1, in which silicon powder is situated, namely 3 gms. having a resistivity exceeding 200 ohm-cm. on which a dot of Al of 7 mgs. bears and 3 gms. of silicon powder which contains $2.10^{20}$ at./cc. As. By diffusion for 13 hours at 1240° C. the diffusion regions 22 and 29 are obtained which have a depth of 33 μm. and are destined for contacting afterwards the layers 23 and 28, respectively. In the layer 23 which, from the surface through which diffusion is carried out, has a depth of approximately 53 μm., Al predominates which diffuses much more quickly than As. Moreover, Al also diffuses through the layer of borate glass 22. The diffusion region of As, 24, has a depth of 11 μm. On the side of the disk which is entirely covered with the layer of borate glass 25 a boron layer 29 is diffused to a depth of 33 μm. below the semiconductor surface. Below this boron layer also an aluminum layer 28 is situated having a thickness of 53 μm. The region 27 having a thickness of 119 μm. still remains from the n-type disk from which it was started. By means of the embodiment of the method according to the invention described here, a thyristor can be manufactured. The above described semiconductor disks are further processed in a manner known to those skilled in the art by exposing, if required, the parts of the semiconductor surface to be contacted by means of photoetching methods, contacting the unmasked parts and covering the semiconductor device with a protective layer. When a disk comprises several semiconductor devices it is divided, then contacted, provided, if desirable, with a passivating layer, and provided in a suitable envelope. With the above described examples, not all the possibilities which are provided by the method according to the invention, are summed up. For example, in this manner diodes, for example, Zener diodes, can be manufactured. This is carried out in a manner quite analogous to the manufacture of the transistor described in Example 2, with the difference that the substrate in this case consists of boron-doped silicon (resistivity 0.1 ohm-cm.) and instead of boron from the glass layer, phosphorus diffuses in the semiconductor body from the glass layer with the same surface concentration as the boron.

For example, the impurity in the masking material which adjoins the semiconductor surface may be provided only locally. In this manner a diffusion of Al can be realized at a location where no other impurity is diffused. In addition to the said impurity, for example, Ga, In, Sb and Bi are to be considered as an impurity in the layer of masking material, or as an impurity which is diffused from the gaseous phase. Furthermore, the choice of the semiconductor material is not restricted to silicon. Germanium and $A^{III}B^{V}$-compounds may alternatively be used as semiconductor materials.

What is claimed is:

1. A method of manufacturing a semiconductor device having a semiconductor body, comprising the steps of applying a masking layer containing an impurity to a selected first surface portion of the semiconductor body while leaving a selected second surface portion of the semiconductor body free of the masking layer, diffusing the impurity into the semiconductor body with a diffusion process, and checking the diffusion of the impurity into the second surface portion by performing the diffusion process in the presence of a semiconductor powder.

2. A method as claimed in claim 1 wherein the powder used comprises the same semiconductor material as the semiconductor body.

3. A method as claimed in claim 1 wherein the diffusion process is carried out in a closed space.

4. A method as claimed in claim 3, wherein the space is evacuated and hermetically sealed prior to the diffusion process.

5. A method as claimed in claim 1 wherein the impurity is diffused from the layer of the masking material in the underlying part of the semiconductor body.

6. A method as claimed in claim 5 wherein the impurity is only locally provided in the masking material which adjoins the semiconductor surface.

7. A method as claimed in claim 1, wherein at least one other impurity is diffused from the gaseous phase at least in the unmasked part of the semiconductor surface.

8. A method as claimed in claim 7, wherein the semiconductor powder comprises an impurity which is diffused from the gaseous phase in powder form.

9. A method as claimed in claim 7 wherein the semiconductor powder comprises an impurity which is diffused from the gaseous phase in a solid solution.

References Cited

UNITED STATES PATENTS 3,484,309 12/1969 Gilbert ............ 148—187

L. DEWAYNE RUTLEDGE, Primary Examiner

J. M. DAVIS, Assistant Examiner

U.S. Cl. X.R.

29—576; 148—188